United States Patent Office 2,929,940

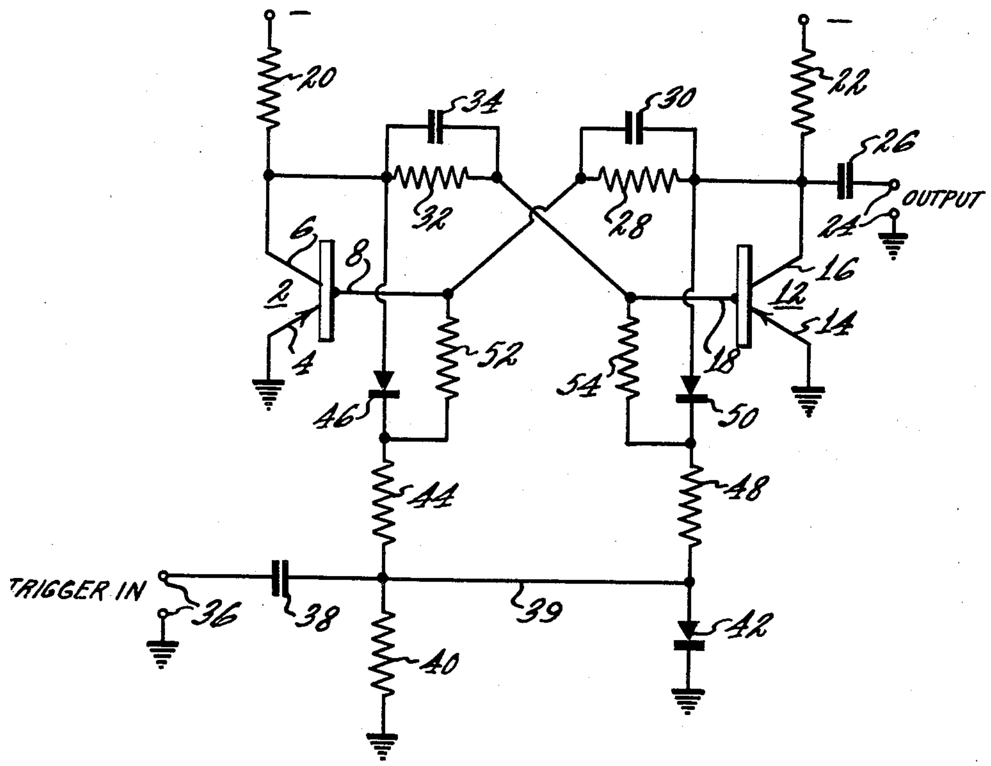
INVENTOR.
JOHN PAUL JONES, JR.

Patented Mar. 22, 1960

2,929,940

TRANSISTOR BISTABLE CIRCUIT

John Paul Jones, Jr., Pottstown, Pa., assignor to Navigation Computer Corporation, a corporation of Pennsylvania Application March 7, 1957, Serial No. 644,547

3 Claims. (Cl. 307—88.5)

This invention relates to bistable circuits and in particular to bistable multivibrator circuits utilizing transistors as active elements.

One known type of transistor bistable multivibrator circuit uses a pair of transistors. The emitters of the pair of transistors are maintained at ground potential and the base electrodes are cross-coupled to the collector electrodes. The circuit parameters are chosen so that the circuit can remain in either one of two stable states. In one of the stable states, one of the transistors is highly conductive and the other transistor is cut off, while in the second stable state the second transistor is conductive and the first transistor is cut off. The circuit switches from one stable state to another by the application of trigger pulses to the transistors. Generally, the trigger pulses are applied to the base electrodes.

In order to maintain relatively stable and reliable operation of transistor bistable multivibrator circuits of the type described, the characteristics of the transistors used must be rather closely matched. As an example, if the gain of one transistor is determined to be of a certain magnitude, it is desirable that the gain of the second transistor be of the same order of magnitude. In actual practice, however, it is relatively difficult and expensive to match transistor characteristics as closely as desirable.

It is, therefore, an object of the present invention to provide an improved transistor multivibrator circuit which does not require transistors having closely matched characteristics.

It is another object of this invention to provide improved means, in a transistor multivibrator circuit, for applying trigger pulses to the transistors used therein.

Another major consideration in the design of transistor multivibrator circuits is the triggering sensitivity. Conventional transistor multivibrator circuits require trigger pulses of relatively large amplitude to switch the circuit from one stable state to the other. It is also desirable that the circuit rapidly switch from one stable state to the other.

It is another object of the present invention to provide improved triggering means for a transistor multivibrator circuit which permits the switching from one stable state to another with relatively low amplitude voltage trigger pulses.

It is a still further object of the present invention to provide an improved transistor multivibrator circuit which is characterized by relatively reliable and high-speed circuit operation.

According to the invention, a transistor bistable multivibrator circuit of the type described is triggered by the application of relatively low amplitude trigger pulses to the base of the non-conducting transistor. This is accomplished by connecting an input trigger terminal through unilateral conducting devices to the collector electrodes of each of the transistors. Conductive paths are also provided from the input terminal to the base electrodes of each of the transistors. The unilateral conducting devices provide a low impedance path when the transistor with which each is associated is conductive. The circuit is switched from one stable state to the other when the trigger pulses are applied to the base electrode of the non-conducting transistor.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which the single figure is a schematic circuit diagram of a transistor multivibrator circuit embodying the invention.

Referring now to the drawing, a bistable multivibrator circuit embodying the invention includes a pair of transistors 2 and 12, which may be considered to be junction transistors of the P-N-P type, although other types could be used, including transistors of an opposite conductivity type such as N-P-N junction transistors. The transistors 2 and 12 include respective emitter electrodes 4 and 14, collector electrodes 6 and 16, and base electrodes 8 and 18. The collector electrodes 6 and 16 are connected through direct-current conductive impedance means, illustrated as a pair of identical resistors 20 and 22, respectively, which may each be 4,300 ohms, to the negative terminal of a suitable source of energizing potential, such as a negative 20 volt direct-current supply, for example. The resistor 22 serves as an output load impedance element for the circuit. Output pulses are derived from a pair of output terminals 24, one of which is connected to a point of reference potential or circuit ground and the other of which is connected through a coupling capacitor 26 to the collector 16.

To provide the desired bistable circuit operation, the base and collector electrodes of the transistors are cross-coupled. Thus, the base 8 of the transistor 2 is connected to the collector 16 of the transistor 12 through the parallel combination of a coupling resistor 28 and capacitor 30. Similarly, the base 18 of the transistor 12 is connected to the collector 6 of the transistor 2 through the parallel combination of a coupling resistor 32 and capacitor 34. The emitters 4 and 14 are connected to chassis ground. In a typical example, the resistors 28 and 32 may each be 68,000 ohms and the capacitors 30 and 34 may each be 100 micromicrofarads.

To apply trigger pulses of a negative polarity to the circuit to trigger it from one stable state to another, a pair of input terminals 36 are provided. One of the input terminals 36 is grounded, while the other is connected through a coupling capacitor to a common triggering lead 39 or bus. A coupling resistor 40, which may have a value of 8,200 ohms, and a diode 42 are each connected from the lead 39 to ground. The diode 42 is poled to provide a low impedance shunt path to ground for positive trigger pulses. The ungrounded input terminal is also connected through the coupling capacitor 38 and identical serially connected resistors and unilateral conducting devices, such as diodes, to the respective collector electrodes 6 and 16 of the transistors 2 and 12. Thus, the coupling capacitor 38 is connected through the serially connected resistor 44 and diode 46 to the collector 6 of the transistor 2 and through a serially connected resistor 48 and diode 50 to the collector 16 of the other transistor 12. The resistors 44 and 48 may be 4,300 ohms each, for example. To complete the circuit, in accordance with the invention, identical resistors are connected from the junction of the serially connected diodes and resistors to the respective base electrodes of the transistors. Accordingly, a resistor 52 is connected from the junction of the resistor 44 and the diode 46 to the base 8 of the transistor 2. Similarly, a resistor 54 is connected from the junction of the resistor 48 and the diode 50 to the base 18 of the other transistor 12. The resistors 52 and 54 may be 8,200 ohms each in a typical example. It is to be noted that if opposite conductivity transistors were used, each of the diodes as well as the collector supply voltage would be reversed in polarity.

In operation, assume that the multivibrator circuit is in the stable state of operation wherein the transistor 12 is conductive and the transistor 2 is cut off. During this stable state of operation, current flows out of the collector 16 of the conductive transistor 12 and through the load resistor 22, causing a voltage drop thereacross which will make the collector voltage of the conducting transistor 12 essentially zero. Since the base 8 of the cut-off transistor 2 is at essentially the same voltage as the collector of the conducting transistor 12, the voltage between the base 8 and emitter 4 of the transistor 2 will be zero and the transistor 2 will remain cut off. Since the transistor 2 is cut off, its collector 6 will essentially be at the voltage of the supply, in this case 20 volts negative. Accordingly, the diode 46 will be biased in the reverse, relatively non-conducting direction. The voltage across the other diode 50, however, will be essentially zero since the voltage on the collector 16 of the conducting transistor 12 is essentially zero.

If a negative trigger pulse of relatively small magnitude is now applied to the terminals 36 it will be coupled through the capacitor 38 and the resistor 48 to the cathode of the diode 50. The diode 50 will, accordingly, be conductive in the forward direction and provide a low impedance path. The negative trigger pulse is thus coupled through the diode 50 and the collector-emitter circuit of the transistor 12 to ground. The negative trigger thus has no effect on the conducting transistor 12.

A negative trigger pulse will also be applied through the input coupling capacitor and the resistor 44 to the cathode of the other diode 46. The diode 46, however, is reverse biased by the negative collector supply voltage for the transistor 2. Hence, it provides, a high impedance to the triggering pulse. Accordingly, the negative trigger pulse is applied through the resistor 52 to the base 8 of the transistor 2. The application of the negative trigger pulse forward biases the transistor 2 and it begins to conduct. Collector current flow through the resistor 20 causes a voltage drop thereacross which will make the voltage at the collector 6 essentially zero. Since the base voltage of the other transistor 12 is determined by the collector voltage of the transistor 2, the emitter-base circuit of the transistor 12 is no longer forward biased and the transistor 12 will be cut off. Upon the application of the next negative trigger pulse the cycle repeats to provide bistable circuit operation in response to the trigger pulses.

Triggering of a transistor bistable circuit is achieved, according to the teachings of this invention, with relatively small amplitude trigger pulses. The trigger pulses need not overcome the reverse bias of a steering diode as in prior art circuits, but are applied directly to the base electrode of the non-conductive transistor to switch the circuit from one stable state to another. Thus the trigger pulse need only be large enough to bias the non-conductive transistor in the forward direction. This also permits reliable circuit operation without the need for critically balanced transistors. Furthermore, the gain of the conducting transistor is utilized to provide a relatively high impedance path for the trigger pulses. Thus, rapidly switching action as well as a high degree of circuit reliability and triggering sensitivity are achieved according to the teachings of this invention.

What is claimed is:

1. A transistor bistable circuit comprising, in combination, a pair of transistors each including base, emitter, and collector electrodes, means coupling the base electrode of one of said transistors with the collector electrode of the other of said transistors, means coupling the base electrode of the other of said transistors with the collector electrode of said one of said transistors, means providing a trigger input terminal for applying trigger pulses to said circuit to trigger said circuit from one stable state to another stable state, means including a first resistor and a first unilateral conducting device connecting said input terminal with the collector electrode of said one of said transistors, means including a second resistor and a second unilateral conducting device connecting said input terminal with the collector electrode of said other of said transistors, means providing a source of biasing potential connected with said collector electrodes and with said unilateral conducting devices to bias said devices in the non-conducting direction, said first and second unilateral conducting devices being poled in said circuit to be responsive to a current conducting condition of said one and said other transistor respectively to provide a low impedance path through the collector-emitter circuit of said transistors in response to trigger pulses of one polarity, means connecting the base electrode of said one of said transistors to the junction of said first resistor and said first unilateral conducting device to apply trigger pulses to the base electrode of said one of said transistors when said one of said transistors is non-conductive, and means connecting the base electrode of said other of said transistors to the junction of said second resistor and said second unilateral conducting device to apply trigger pulses to the base electrode of said other of said transistors when said other of said transistors is non-conductive.

2. A triggered bistable circuit comprising, in combination, a first and a second transistor each including a base, an emitter, and a collector electrode, means connecting the collector of said first transistor with the base of said second transistor, means connecting the collector of said second transistor with the base of said first transistor, means providing a source of operating potential connected with said collector electrodes, means providing a trigger input terminal, means including a first resistor and a first unilateral conducting device connecting said input terminal with the collector of said first transistor and with said source, said first unilateral conducting device being poled in said circuit to be reverse biased by said source and to provide a low impedance path to trigger pulses of one polarity in response to a current conducting condition of said first transistor, means including a second resistor and a second unilateral conducting device connecting said input terminal with the collector of said second transistor and with said source, said second unilateral conducting device being poled in said circuit to be reverse biased by said source and to provide a low impedance path to trigger pulses of said one polarity in response to a current conducting condition of said second transistor, means including a third resistor connecting the base electrode of said first transistor to the junction of said first resistor and said first unilateral conducting device for applying trigger pulses to the base electrode of said first transistor when said first transistor is non-conductive to render said first transistor conductive, and means including a fourth resistor connecting the base electrode of said second transistor to the junction of said second resistor and said second unilateral conducting device for applying trigger pulses to the base electrode of said second transistor when said second transistor is non-conductive to render said second transistor conductive.

3. A triggered bistable circuit comprising, in combination, a first and a second transistor each including a base, an emitter, and a collector electrode, means connecting the collector of said first transistor with the base of said second transistor, means connecting the collector of said second transistor with the base of said first transistor, means connecting said emitter electrodes to a point of reference potential in said circuit, means providing a source of operating potential, means including a first resistor connecting said source with the collector electrode of said first transistor, means including a second resistor connecting said source with the collector electrode of said second transistor, means providing a trigger input terminal, means including a third resistor and a first diode connecting said input terminal with the collector of said first transistor, said first diode being poled in said circuit to be reverse biased by said source and to provide a low impedance path to trigger pulses of one polarity in response to a current conducting condition of said first transistor, means including a fourth resistor and a second diode connecting said input terminal with the collector of said second transistor, said second diode being poled in said circuit to be reverse biased by said source and to provide a low impedance path to trigger pulses of said one polarity in response to a current conducting condition of said second transistor, means including a fifth resistor connecting the base electrode of said first transistor to the junction of said first diode and said third resistor for applying trigger pulses to the base electrode of said first transistor when said first transistor is non-conductive to render said first transistor conductive, and means including a sixth resistor connecting the base electrode of said second transistor to the junction of said second diode and said fourth resistor for applying trigger pulses to the base electrode of said second transistor when said second transistor is non-conductive to render said second transistor conductive.

References Cited in the file of this patent

UNITED STATES PATENTS

| | | |
|---|---|---|
| 2,478,683 | Bliss | Aug. 9, 1949 |
| 2,823,856 | Booth | Feb. 18, 1958 |
| 2,875,419 | Hoge | Mar. 24, 1959 |

FOREIGN PATENTS

| | | |
|---|---|---|
| 766,210 | Great Britain | Jan. 16, 1957 |